United States Patent
Ooae et al.

(10) Patent No.: US 6,911,780 B2
(45) Date of Patent: Jun. 28, 2005

(54) ELECTRON BEAM, GENERATING DEVICE, AND TESTING DEVICE

(75) Inventors: Yoshihisa Ooae, Tokyo (JP); Yoichi Shimizu, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/434,620

(22) Filed: May 9, 2003

(65) Prior Publication Data

US 2003/0201720 A1 Oct. 30, 2003

Related U.S. Application Data

(63) Continuation of application No. PCT/JP01/10020, filed on Nov. 16, 2001.

(30) Foreign Application Priority Data

Nov. 27, 2000  (JP) ........................................ 2000-360076

(51) Int. Cl.$^7$ ............................... H01J 7/24; G21K 5/10
(52) U.S. Cl. ............................... 315/111.81; 250/492.23
(58) Field of Search ................................ 315/32, 39.57, 315/111.71, 111.81, 111.91; 250/492.3, 398, 492.1, 492.2, 492.21, 492.23, 493.1

(56) References Cited

U.S. PATENT DOCUMENTS 5,003,178 A * 3/1991 Livesay ..................... 250/492.3
6,407,399 B1 * 6/2002 Livesay ..................... 250/492.3
6,504,159 B1 * 1/2003 Keller ...................... 250/423 R
6,617,593 B2 * 9/2003 Lien ........................ 250/492.21

FOREIGN PATENT DOCUMENTS

| JP | 40-25466 | 8/1965 |
| JP | 58-103134 | 6/1983 |
| JP | 7-223814 | 8/1995 |
| JP | 11-87206 | 3/1999 |

* cited by examiner

*Primary Examiner*—Hoanganh Le
*Assistant Examiner*—Minh Dieu A
(74) *Attorney, Agent, or Firm*—Morrison & Foerster LLP

(57) ABSTRACT

An electron beam generating device, wherein a high-resistance film is formed on the outer surface of an insulator provided with a cathode for emitting thermal electrons and a grid for collecting thermal electrons and forming an electron beam to allow a feeble current to flow to the high-resistance film, thereby preventing the accumulation of thermal electrons on the insulator and discharging. The upper portion of the high-resistance film connected to a chamber supplies an approximate reference potential to the upper portion of the film, and the lower portion of the high-resistance film connected to the grid supplies almost the same potential as that of the grid to the lower portion of the film to allow a feeble current to flow to the film. The prevention of accumulation of thermal electrons on the insulator can prevent discharging, accurately control the current capacity of an electron beam, and give the electron beam generating device a longer service life.

12 Claims, 2 Drawing Sheets

ELECTRON BEAM, GENERATING DEVICE, AND TESTING DEVICE

The present application is a continuation application of PCT/JP01/10020 filed on Nov. 16, 2001, claiming priority from a Japanese patent application No. 2000-360076 filed on Nov. 27, 2000, the contents of which are incorporated herein by reference.

BACKGROUND OF THE INVENTION

1. Field of the Invention

The present invention relates to an electron beam exposure apparatus and an electron beam generating device for exposing a wafer by an electron beam. More particularly, it relates to an electron beam exposure apparatus and an electron beam generating device which prevents electric discharge between an insulator, on which an electron gun is mounted, and ground potential.

2. Description of Related Art

With miniaturization of semiconductor devices in recent years, improvement in irradiation uniformity of an electron beam in an electron beam exposure apparatus is required. The irradiation uniformity of the electron beam is deteriorated by change of potential difference between a cathode and a grid in the electron beam exposure apparatus, exhaustion of the cathode, etc. Conventionally, the potential difference between the cathode and the grid is adjusted by an element called self-bias resistance.

On the other hand, since there is no effective remedy for preventing the exhaustion of the cathode, it has been desired to extend the service life of the cathode. The cause of the cathode exhaustion greatly originates in decreasing of the degree of vacuum in the vacuum area of the electron beam exposure apparatus due to, for example, the electric discharge in the vicinity of the electron beam generating device. Discharge gas is generated in an electric discharge path by the energy release during the electric discharge, the discharge gas is ionized by the electron beam, and the cathode is spattered with the ionized discharge gas, by which the cathode is exhausted.

In the conventional electron beam exposure apparatus, thermal electrons emitted from cathode are accumulated in an insulating part of an insulator, the electric discharge occurs by the accumulated thermal electrons, and the degree of vacuum of the vacuum area is decreased. The electric discharge on the surface of the insulator generates the great amount of the discharge gas, and degrades the degree of vacuum more than an order of magnitude. Moreover, due to the electric discharge on the surface of the insulator, the acceleration voltage for accelerating the thermal electrons emitted from the cathode in the direction of the wafer is fluctuated, the current of the electron beam is also fluctuated, and accuracy of the wafer exposure was degraded.

SUMMARY OF THE INVENTION

Therefore, it is an object of the present invention to provide a testing device which can solve the foregoing problem. The above and other objects can be achieved by combinations described in the independent claims. The dependent claims define further advantageous and exemplary combinations of the present invention.

According to the first aspect of the present invention, there is provided an electron beam generating device for generating an electron beam. The electron beam generating device includes: a cathode for generating thermal electrons; a cathode voltage source for applying negative voltage to the cathode so that the thermal electrons are emitted from the cathode; a grid for collecting the thermal electrons emitted from the cathode and forming the electron beam; a grid voltage source for applying negative voltage to the grid, the potential of the grid being lower than that of the cathode; and an insulator for insulating the cathode voltage source and the grid voltage source from the thermal electrons generated by the cathode. At least a part of outer surface of the insulator is covered with high-resistance film.

In the first aspect of the present invention, it is preferable that the outer surface of the insulator is covered with the high-resistance film or conductor. Moreover, it is preferable that an upper portion of the high-resistance film electrically connects with a reference potential unit having reference potential. Moreover, it is preferable that a lower portion of the high-resistance film electrically connects with the grid. Moreover, the insulator may include a first electrode on the outer surface, the first electrode being electrically connected to the reference potential unit, and the upper portion of the high-resistance film may be electrically connected to the first electrode. Moreover, the insulator may include a second electrode on the outer surface, the second electrode being electrically connected to the grid, and the lower portion of the high-resistance film may be electrically connected to the second electrode. Moreover, the high-resistance film of the insulator may include metal oxide. The metal oxide may be indium oxide.

According to the second aspect of the present invention, there is provided an electron beam exposure apparatus for exposing a wafer by an electron beam. The electron beam exposure apparatus includes: an electron beam generating device for generating the electron beam; a deflector for deflecting the electron beam to a predetermined position on the wafer; and a stage for supporting the wafer. The electron beam generating device includes: a cathode for generating thermal electrons; a cathode voltage source for applying negative voltage to the cathode so that the thermal electrons are emitted from the cathode; a grid for collecting the thermal electrons emitted from the cathode and forming the electron beam; a grid voltage source for applying negative voltage to the grid, the potential of the grid being lower than that of the cathode; and an insulator for insulating the cathode voltage source and the grid voltage source from the thermal electrons generated by the cathode. At least a part of outer surface of the insulator is covered with high-resistance film.

In the second aspect of the present invention, The electron beam exposure apparatus may further include: a chamber for storing the electron beam generating device, the deflector, and the stage; and a pressure reduction means for reducing pressure inside the chamber. A vacuum area, which is an area evacuated by the pressure reduction means, in the chamber may be surrounded with the high-resistance film or a conductor. An upper portion of the high-resistance film may electrically connect with the chamber.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
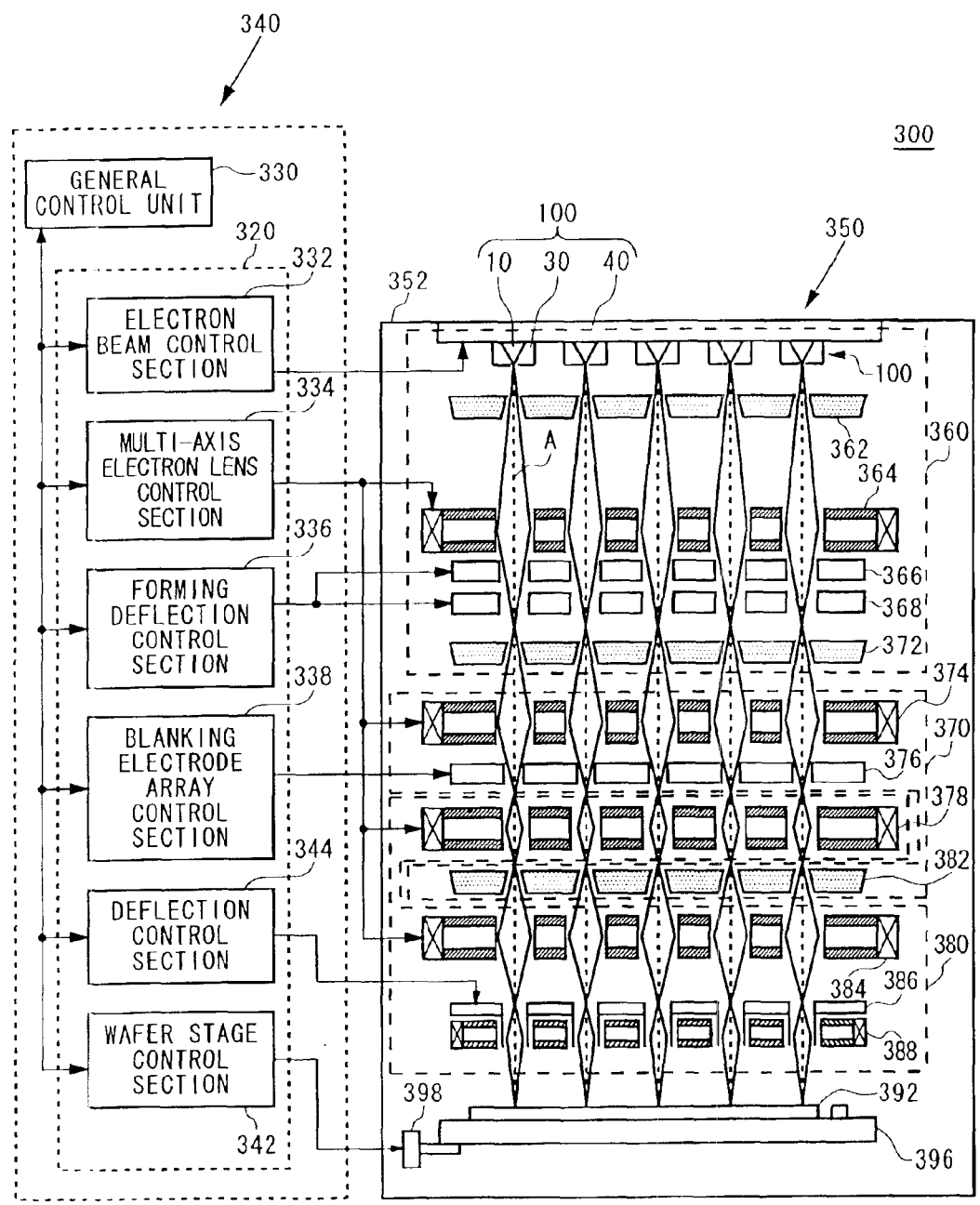
FIG. 1 shows a configuration of the electron beam exposure apparatus according to an embodiment of the present invention.

FIG. 1 shows a configuration of the electron beam exposure apparatus 300 according to an embodiment of the present invention. The electron beam exposure apparatus 300 includes an exposure section 350 for performing a predetermined exposure processing on the wafer 392 by an electron beam, and a control system 340 for controlling operation of each component of the exposure section 350.

The exposing unit 350 includes an electron optics system which includes an electron beam forming means 360 for generating a plurality of electron beams and forming cross-sectional shape of the electron beams into desired forms inside a chamber 352, an irradiation switching means 370 for independently switching whether or not the plurality of electron beams are to be irradiated on the wafer 392, and a wafer projection system 380 for adjusting direction and size of an image of a pattern which is transcribed on the wafer 392. The exposing unit 350 also includes a stage section including a wafer stage 396 for supporting the wafer 392 on which the pattern is exposed, and a wafer stage drive unit for driving the wafer stage 396.

The electron beam forming means 360 includes a plurality of electron beam generating apparatuses 100 for generating a plurality of electron beams, a first forming member 362 and a second forming member 372 having a plurality of apertures which form the cross-sectional shapes of the irradiated electron beams by allowing the electron beams to pass through the apertures, a first multi-axis electron lens 364 for adjusting focal points of the plurality of electron beams by independently collecting each of the plurality of electron beams, and a first forming deflector 366 and a second forming deflector 368 for independently deflecting the plurality of electron beams which have passed through the first forming member 362.

Each of the electron beam generating apparatuses 100 includes: a cathode 10 for generating thermal electrons; a cathode voltage source for applying negative voltage to the cathodes 10 so that the thermal electrons are emitted from the cathodes 10; a grid 30 for collecting the thermal electrons emitted from the cathode 10, and for forming the electron beam; a grid voltage source for applying negative voltage, which is lower than the voltage of the cathode 10, to the grid 30; and an insulator 40 for insulating the cathode voltage source and the grid voltage source from the thermal electrons generated by the cathode 10. At least a part of outer surface of the insulator 40 is covered with high electric resistance film. According to the present embodiment, an upper portion of the high electric resistance film connects with the chamber 352, and the chamber 352 is grounded. A lower portion of the high electric resistance film electrically connects with the grids 30 via a field limiting flange. Negative voltage is applied to the grid 30 from the grid voltage source, and substantially the same electric potential as the grid 30 is applied to the lower portion of the high electric resistance film. Feeble current flows on the high electric resistance film by electric potential difference between the upper portion of the high electric resistance film and the lower portion of the high electric resistance film, so that accumulation of the thermal electrons emitted from the cathode 10 on a surface of the insulator 40 is avoided.

The exposure switching unit 370 includes a second multi-axis electron lens 374 for adjusting focal points of a plurality of electron beams by independently collecting each of a plurality of electron beams, a blanking electrode array 376 for independently switching whether or not each of the electron beams is to be irradiated on the wafer 392 by deflecting each of the plurality of electron beams independently, and an electron beam blocking unit 382, which includes a plurality of apertures through which the electron beams pass, for blocking the electron beam deflected by the blanking electrode array 376. In another embodiment, the blanking electrode array 376 is a blanking aperture array device.

The wafer projection system 380 includes a third multi-axis electron lens 378 for independently collecting each of a plurality of electron beams and decreasing irradiated cross-sectional area of the electron beams, a fourth multi-axis electron lens 384 for independently collecting each of a plurality of electron beams and adjusting a focal point of each of the electron beams, a deflecting unit 386 for independently deflecting each of the plurality of electron beams into a desired location on the wafer 392, and a fifth multi-axis electron lens 388, which acts as an object lens for the wafer 392, for independently collecting each of the plurality of electron beams.

The control system 340 includes a general control unit 330 and an individual control unit 320. The individual control unit 320 includes an electron beam control section 332, a multi-axis electron lens control section 334, a forming deflection control section 336, a blanking electrode array control section 338, a deflection control section 340, and a wafer stage control section 342. For example, the general control unit 330 is a workstation which generally controls each of the controllers included in the individual control unit 320.

The electron beam control section 332 controls the electron beam generating apparatus 100. The multi-axis electron lens control section 334 controls electric current provided to the first multi-axis electron lens 364, the second multi-axis electron lens 374, the third multi-axis electron lens 378, the fourth multi-axis electron lens 384, and the fifth multi-axis electron lens 388. The forming deflection control section 336 controls the first forming deflector 366 and the second forming deflector 368. The blanking electrode array control section 338 controls voltage applied to deflection electrodes of the blanking electrode array 376. The deflection control section 344 controls voltage applied to the deflection electrodes of a plurality of deflectors of the deflecting unit 386. The wafer stage control section 342 controls the wafer stage driver 398 so that the wafer stage 396 is caused to move to a predetermined location.

Figure 2:
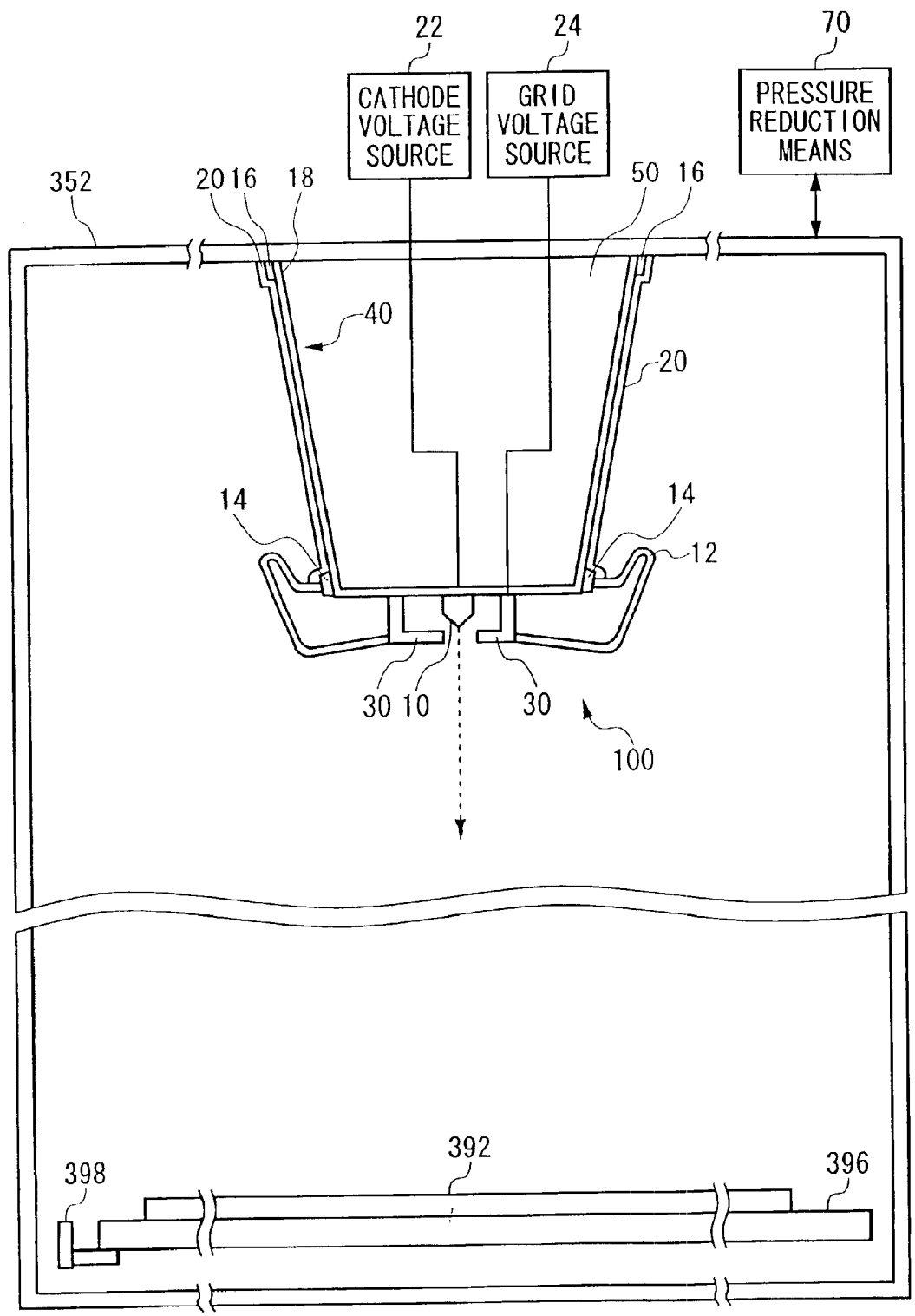
FIG. 2 is a drawing exemplary showing a configuration of an electron beam generating device.

FIG. 2 is a drawing exemplary showing a configuration of the electron beam generating device 100. The electron beam generating apparatus 100 includes: a cathode 10 for generating thermal electrons; a cathode voltage source 22 for applying negative voltage to the cathode 10 so that the thermal electrons are emitted from the cathodes 10; a grid 30 for collecting the thermal electrons emitted from the cathode 10, and for forming the electron beam; a grid voltage source 24 for applying negative voltage, which is lower than the voltage of the cathode 10, to the grids 30; an insulator 40 for insulating the cathode voltage source 22 and the grid voltage source 24 from the thermal electrons generated by the cathode 10; and a field limiting flange 12 for adjusting the electric field. At least a part of outer surface of the insulator 40 is covered with high-resistance film 20. Alternatively, the insulator 40 includes the first electrode 16 on its outside, which is conductor electrically connects with a reference potential section, and the upper portion of the high-resistance film 20 electrically connected to the first electrode 16. It is preferable that the first electrode 16 electrically connects with the reference potential through the chamber 352.

Moreover, it is preferable that the lower portion of the high-resistance film 20 electrically connects with the grid 30. For example, the insulator 40 includes a second electrode 14 on its outside, which is conductor electrically connected to the grid 30, and the lower portion of the high-resistance film 20 electrically connects with the second electrode 14. By applying substantially the same electric potential as that of the grid 30 to the lower portion of the high-resistance film 20 and applying the approximate reference potential to the upper portion of the high-resistance film 20, feeble current flows between the upper portion and the lower portion of the high-resistance film 20, and accumulation of the thermal electrons on the high-resistance film 20 is prevented.

The insulator 40 is fixed to the upper portion of the chamber 352, and the thermal electrons emitted from the cathode 10 are collected by the grid 30 and irradiated on the wafer 392 as an electron beam. Since at least a part of the outer surface of the insulator 40 is covered with the high-resistance film 20 to generate the potential difference between the upper portion and the lower portion of the high-resistance film 20, even if the thermal electrons emitted from the cathode 10 reaches the outer surface of the insulator 40, the thermal electrons are not accumulated on the insulator 40.

It is preferable that the electron beam generating apparatus 300 further includes a pressure reduction means 70 for reducing a pressure inside the chamber 352. It is also preferable that a vacuum area 60, where the pressure is reduced by the pressure reduction means 70, in the chamber 352 is surrounded by the high-resistance film 20 or the conductor. That is, it is preferable that insulating material is not exposed inside the vacuum area 60 of the chamber 352. In the present embodiment, the outer surface of the insulator 40 is covered with the high-resistance film 20 or the conductor. Moreover, it is preferable that the pressure reduction means 70 is capable of reducing the pressure of the vacuum area 60 of the chamber 352 to about $7.5 \times 10^{-11}$ Pascal ($1 \times 10^{-8}$ torr). By covering the outer surface of the insulator 40 with the high-resistance film 20 or the conductor, the insulating material 18 of the insulator 40 is isolated from the vacuum area 60, and accumulation of electric charge by the thermal electrons is prevented.

Moreover, it is preferable that the upper portion of the high-resistance film 20 connects with the chamber 352. By connecting the upper portion of the high-resistance film 20 and the chamber 352, the electric charge of the thermal electrons which reached the high-resistance film 20 flows to the reference potential through the chamber 352 before starting discharging the accumulated charges. In the present embodiment, although the upper portion of the high-resistance film 20 electrically connects with the reference potential through the chamber 352 and the first electrode, in another embodiment, the upper portion of the high-resistance film 20 electrically connects with the reference potential.

It is preferable that a value of resistance of the high-resistance film 20 is selected so as to prevent overload of the grid voltage source 24. For example, when a voltage of −50 kilovolts is applied to the grid 30, it is preferable that the resistance between the upper portion of the high-resistance film 20 and the lower portion of the high-resistance film 20 is in the neighborhood of 0.5 to 500 gigaohms. In this case, the current of about 0.1–100 microamperes flows between the upper portion and the lower portion of the high-resistance film 20, so that the accumulation of the electric charge due to the thermal electrons on the high-resistance film 20 is prevented, and the overload of the grid voltage source 24 is also prevented.

It is preferable that the high-resistance film 20 includes metal oxide, such as indium oxide. In this case, the high-resistance film 20 may be hyaline material in which the indium oxide is mixed substantially evenly. By the high-resistance film 20 including the indium oxide, it is easy to manufacture the high-resistance film 20 of which the value of resistance between the upper portion of the high-resistance film 20 and the lower portion of the high-resistance film 20 is in the neighborhood of 0.5 to 500 gigaohms.

Moreover, in the present embodiment, while the lower portion of the high-resistance film 20 electrically connects with the grid 30 and the electric potential of the high-resistance film 20 is substantially the same as that of the grid 30, the cathode voltage source 22 or a grid voltage source 24 applies the electric potential to the lower portion of the high-resistance film 20 which is different from the reference potential in another embodiment. In this case, it is preferable that the electric potential applied to the lower portion of the high-resistance film 20 is substantially same as that of the cathode 10 or a grid 30. In yet another embodiment, the electron beam generating device 100 further includes a voltage source for applying electric potential, which is different from the reference potential, to the lower portion of the high-resistance film 20.

Height of the field limiting flange 12 is substantially the same as that of the grid 30 in the electron beam irradiation direction. Moreover, it is preferable that the field limiting flange 12 is formed so that it projects into a direction of the first electrode more than the surface on which the cathode 10 and the grid 30 of the insulator 40 are provided. The field limiting flange 12 moderates change of the electric field in the vicinity of the insulator 40, prevents concentration of equipotential lines in the vicinity of the insulator 40, and prevents the electric discharge. The field limiting flange 12 is constructed from conductor, and electrically connects with the grid 30, and has substantially the same electric potential as that of the grid 30. The field limiting ring 12 electrically connects with the lower portion of the high-resistance film 20 or the second electrode 14, and applies substantially the same electric potential as that of the grid 30 to the lower portion of the high-resistance film 20 or the second electrode 14.

Alternatively, the insulator 40 includes a terminal for connecting the cathode 10 and the cathode voltage source 22, and a terminal for connecting the grid 30 and the grid voltage source 24. The terminals are filled up with high melting point wax material in order to maintain the sealing between the vacuum area 60 of the chamber 352 and a high-pressure area 50. Alternatively, the terminals and the exposed surface of the high melting point wax material are covered with oxidation-resistant film, such as golden paste. In this case, the oxidation-resistant film is formed on the insulator 40, and then the high-resistance film 20 is burned on the outer surface of the insulator 40. By burning the high-resistance film 20, the high-resistance film 20 is formed in oxidization atmosphere. Moreover, it is preferable that the melting point of the high melting point wax material is higher than the burning temperature of the high-resistance film 20.

Operation of the electron beam exposure apparatus 300, which has been explained in relation to FIGS. 1 and 2, will be explained hereinafter. First, the plurality of electron beam generating devices 100 generate the plurality of electron beams. The first forming member 362 forms the plurality of electron beams, which are generated by the plurality of electron beam generating devices 100 and irradiated on the first forming member 362, by allowing them to pass through a plurality of apertures of the first forming member 362. In alternate embodiment, a plurality of electron beams are generated by further including means for dividing an electron beam generated by the electron beam generating device 100 into a plurality of electron beams.

The first multi-axis electron lens 364 independently collects each of the plurality of electron beams, which is formed into rectangular shape, and independently adjusts focal point of each of the electron beams to the second forming member 372. The first forming deflector 366 independently deflects the plurality of electron beams, which are formed into rectangular forms by the first forming member, so that the plurality of electron beams are irradiated on desired positions on the second forming member 372.

The second forming deflector 368 deflects the plurality of electron beams deflected by the first forming deflector 366 in substantially perpendicular direction to the second forming member 372, and irradiates them on the second forming member 372. Then the second forming member 372, which includes a plurality of apertures having rectangular forms, further forms the electron beams, which have rectangular cross-sectional forms and are irradiated on the second forming member 372, into the electron beams having desired cross-sectional forms for irradiating them on the wafer 392.

The second multi-axis electron lens 374 independently collects the plurality of electron beams, and independently adjusts the focal point of each of the electron beams to the blanking-electrode array 376. Then, the plurality of electron beams, of which the focal points are adjusted by the second multi-axis electron lens 374, respectively pass through a plurality of apertures of the blanking-electrode array 376.

The blanking electrode array control section 338 controls whether or not the voltage is applied to the deflecting electrodes provided in the vicinity of each of the apertures of the blanking-electrode array 376. The blanking-electrode array 376 selects whether or not each of the electron beams are irradiated on the wafer 392 based on the voltage applied to each of the deflecting electrodes.

The electron beam which is not deflected by the blanking-electrode array 376 passes through the third multi-axis electron lens 378. Then the third multi-axis electron lens 378 reduces the diameter of the electron beam which passes through the third multi-axis electron lens 378. The reduced electron beam passes through an aperture of the electron beam blocking member 382. Moreover, the electron beam blocking member 382 blocks the electron beam deflected by the blanking-electrode array 376. The electron beam which has passed through the electron beam blocking member 382 enters the fourth multi-axis electron lens 384. Then, the fourth multi-axis electron lens 384 independently collects each of the entered electron beams, and respectively adjusts the focal point of each of the electron beams to the deflecting section 386. The electron beam, of which the focal point is adjusted by the fourth multi-axis electron lens 384, enters the deflecting section 386.

The deflection control section 340 controls a plurality of deflectors of the deflecting section 386, and independently deflects each of the electron beams, which enters the deflecting section 386, into the position where it is to be irradiated on the wafer 392. The fifth multi-axis electron lens 388 adjusts the focal point of each of the electron beams to the wafer 392 which passes through the fifth multi-axis electron lens 388. Then, each of the electron beams, having the cross-sectional shape which is to be irradiated on the wafer 392, is irradiated on a desired position of the wafer 392, where it is to be irradiated.

During the exposure processing, it is preferable that the wafer stage drive section 398 continuously moves the wafer stage to a predetermined direction based on a direction from the wafer stage control section 342. Then, according to the movement of the wafer 392, a desired circuit pattern is exposed on the wafer 392 by forming the cross-sectional shape of each of the electron beams to the forms which are to be irradiated on the wafer 392, by selecting the apertures, which allow the passage of the electron beams which are to be irradiated on the wafer 392, and by deflecting each of the electron beams so that it is irradiated on the desired position of the wafer 392.

In the electron beam exposure apparatus 300 explained in relation to FIGS. 1 and 2, while each of the plurality of electron beam generating devices 100 includes the insulator 40 respectively, in another embodiment, the plurality of electron beam generating devices 100 share one insulator 40. That is, the electron beam exposure apparatus 300 includes an electron beam generating device 100 having: a plurality of cathodes 10 for generating thermal electrons; a cathode voltage source unit 22 for applying negative voltage to the plurality of cathodes 10 so that the thermal electrons are emitted from the cathodes 10; a plurality of grids 30, which correspond to the plurality of cathodes 10 respectively, for collecting the thermal electrons emitted from the plurality of cathodes 10 respectively and for forming the plurality of electron beams; the grid voltage source unit 24 for applying negative voltage to the plurality of grids 30, where the potential of each the plurality of grids 30 is lower than the potential of the corresponding cathode 10; and an insulator 40 for insulating the cathode voltage source unit 22 and the grid voltage source unit 24 from the thermal electrons generated by the plurality of cathodes 10. Moreover, in the present embodiment, while the electron beam exposure apparatus 300 includes the plurality of electron beam generating devices 100, the electron beam exposure apparatus 300 includes one electron beam generating device 100 in another embodiment.

As described above, according to the present invention, electric discharge is prevented and the current of the electron beam is controlled accurately by the electron beam generating device 100. Moreover, by preventing electric discharge, exhaustion of the cathode is decreased and the service life of the electron beam generating device 100 is extended.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. An electron beam generating device for generating an electron beam, comprising:
a cathode for generating thermal electrons;
a cathode voltage source for applying negative voltage to said cathode so that the thermal electrons are emitted from said cathode;

a grid for collecting the thermal electrons emitted from said cathode and forming the electron beam;

a grid voltage source for applying negative voltage to said grid, the potential of said grid being lower than that of said cathode; and an insulator for insulating said cathode voltage source and said grid voltage source from the thermal electrons generated by said cathode, at least a part of an outer surface of said insulator being covered with a high-resistance film.

2. The electron beam generating device as claimed in claim 1, wherein the outer surface of said insulator is covered with the high-resistance film or conductor.

3. The electron beam generating device as claimed in claim 2, wherein an upper portion of the high-resistance film electrically connects with a reference potential unit having a reference potential.

4. The electron beam generating device as claimed in claim 2, wherein a lower portion of the high-resistance film electrically connects with said grid.

5. The electron beam generating device as claimed in claim 3, wherein said insulator comprises a first electrode on the outer surface, said first electrode being electrically connected to the reference poterual unit, and the upper portion of the high-resistance film is electrically connected to said first electrode.

6. The electron beam generating device as claimed in claim 4, wherein said insulator comprises a second electrode on the outer surface, said second electrode being electrically connected to said grid, and the lower portion of the high-resistance film is electrically connected to said second electrode.

7. The electron beam generating device as claimed in claim 1, wherein the high-resistance film of said insulator comprises metal oxide.

8. The electron beam generating device as claimed in claim 7, wherein said metal oxide is indium oxide.

9. An electron beam exposure apparatus for exposing a wafer by an electron beam, comprising:

an electron beam generating device for generating the electron beam;

a deflector for deflecting the electron beam to a predetermined position on the wafer; and a stage for supporting the wafer; wherein said electron beam generating device comprises:

a cathode for generating thermal electrons;

a cathode voltage source for applying negative voltage to said cathode so that the thermal electrons are emitted from said cathode;

a grid for collecting the thermal electrons emitted from said cathode and forming the electron beam;

a grid voltage source for applying negative voltage to said grid, the potential of said grid being lower than that of said cathode; and an insulator for insulating said cathode voltage source and said grid voltage source from the thermal electrons generated by said cathode, at least a part of an outer surface of said insulator being covered with a high-resistance film.

10. The electron beam exposure apparatus as claimed in claim 9, further comprising:

a chamber for storing said electron beam generating device, said deflector, and said stage; and a pressure reduction means for reducing pressure inside said chamber; wherein a vacuum area, which is an area evacuated by said pressure reduction means, in said chamber is surrounded with the high-resistance film or a conductor.

11. The electron beam exposure apparatus as claimed in claim 9, wherein an upper portion of the high-resistance film electrically connects with said chamber.

12. An electron beam generating device for generating an electron beam, comprising:

a cathode for generating the electron beam;

a voltage source for applying a voltage to said cathode so that the electron beam is emitted from said cathode;

an insulator for insulating said voltage source from the electron beam generated by said cathode; and a high-resistance film for covering at least a part of an outer surface of said insulator.

* * * * *